(12) United States Patent
Xia et al.

(10) Patent No.: US 9,515,010 B2
(45) Date of Patent: Dec. 6, 2016

(54) SEMICONDUCTOR PACKAGING STRUCTURE AND FORMING METHOD THEREFOR

(71) Applicant: NANTONG FUJITSU MICROELECTRONICS CO., LTD., Nantong (CN)

(72) Inventors: Xin Xia, Nantong (CN); Wanchun Ding, Nantong (CN); Guohua Gao, Nantong (CN)

(73) Assignee: NANTONG FUJITSU MICROELECTRONICS., LTD., Nantong (CN)

( * ) Notice: Subject to any disclaimer, the term of this patent is extended or adjusted under 35 U.S.C. 154(b) by 0 days.

(21) Appl. No.: 14/780,233

(22) PCT Filed: Jun. 26, 2014

(86) PCT No.: PCT/CN2014/080839
§ 371 (c)(1),
(2) Date: Sep. 25, 2015

(87) PCT Pub. No.: WO2015/123952
PCT Pub. Date: Aug. 27, 2015

(65) Prior Publication Data
US 2016/0043020 A1 Feb. 11, 2016

(30) Foreign Application Priority Data
Feb. 24, 2014 (CN) .......................... 2014 1 0061267
Feb. 24, 2014 (CN) .......................... 2014 1 0061904

(51) Int. Cl.
*H01L 21/44* (2006.01)
*H01L 23/495* (2006.01)
(Continued)

(52) U.S. Cl.
CPC ..... *H01L 23/49537* (2013.01); *H01L 21/4828* (2013.01); *H01L 21/56* (2013.01);
(Continued)

(58) Field of Classification Search
CPC ............... H01L 23/293; H01L 23/3107; H01L 23/3135; H01L 23/49537; H01L 23/49548; H01L 21/56; H01L 21/4828; H01L 24/06; H01L 24/17
(Continued)

(56) References Cited

U.S. PATENT DOCUMENTS 4,982,265 A * 1/1991 Watanabe ................ G11C 5/00
174/551
5,471,092 A * 11/1995 Chan ....................... H01L 24/10
257/751
(Continued)

FOREIGN PATENT DOCUMENTS

CN          101211878          7/2008
CN          102231376          11/2011
(Continued)

*Primary Examiner* — Nitin Parekh
(74) *Attorney, Agent, or Firm* — Harness, Dickey & Pierce, P.L.C.

(57) ABSTRACT

The present invention provides a semiconductor package structure, including: a chip, wherein bonding pads and a passivation layer are arranged on the surface of the chip, the passivation layer is provided with first openings for exposing the bonding pads, and a seed layer connected with the bonding pads and columnar salient points stacked on the seed layer are arranged on the bonding pads; lead frames, wherein each lead frame is provided with a plurality of discrete pins, and internal pins and external pins are respectively arranged on two opposite surfaces of the pins; the chip being flipped on the lead frames, and the columnar salient points being connected with the internal pins; a plastic package layer, wherein the plastic package layer is used for (Continued)

sealing the chip, the columnar salient points and the lead frames and exposing the external pins. By adopting the present invention, a transverse area occupied by the package structure is decreased, the volume of the entire package structure is correspondingly decreased, and the integration level of the package structure is improved. The present invention further provides a forming method of the semiconductor package structure.

8 Claims, 5 Drawing Sheets

(51) Int. Cl.
    *H01L 23/31*      (2006.01)
    *H01L 21/48*      (2006.01)
    *H01L 21/56*      (2006.01)
    *H01L 23/29*      (2006.01)
    *H01L 23/00*      (2006.01)

(52) U.S. Cl.
    CPC ........ *H01L 23/293* (2013.01); *H01L 23/3107* (2013.01); *H01L 23/3135* (2013.01); *H01L 23/3171* (2013.01); *H01L 23/49548* (2013.01); *H01L 23/49572* (2013.01); *H01L 23/49582* (2013.01); *H01L 24/03* (2013.01); *H01L 24/06* (2013.01); *H01L 24/17* (2013.01); *H01L 24/81* (2013.01); *H01L 2224/13083* (2013.01); *H01L 2224/13147* (2013.01); *H01L 2224/16245* (2013.01); *H01L 2224/48091* (2013.01); *H01L 2224/48247* (2013.01); *H01L 2224/81801* (2013.01); *H01L 2924/0105* (2013.01); *H01L 2924/01013* (2013.01); *H01L 2924/01022* (2013.01); *H01L 2924/01024* (2013.01); *H01L 2924/01028* (2013.01); *H01L 2924/01029* (2013.01); *H01L 2924/01073* (2013.01); *H01L 2924/2064* (2013.01)

(58) Field of Classification Search
    USPC .......................... 257/666, 737; 438/613–615
    See application file for complete search history.

(56) References Cited

U.S. PATENT DOCUMENTS

| | | | | |
|---|---|---|---|---|
| 5,656,863 | A * | 8/1997 | Yasunaga | H01L 21/565 257/778 |
| 5,736,456 | A * | 4/1998 | Akram | H01L 24/11 257/E21.508 |
| 6,224,690 | B1 * | 5/2001 | Andricacos | B32B 15/01 148/400 |
| 6,417,089 | B1 * | 7/2002 | Kim | H01L 24/11 257/E21.508 |
| 6,429,046 | B1 * | 8/2002 | Marlin | H01L 24/11 257/778 |
| 2012/0313234 | A1 | 12/2012 | Shen | |
| 2015/0014843 | A1 * | 1/2015 | Lehr | H01L 24/11 257/737 |

FOREIGN PATENT DOCUMENTS

| | | |
|---|---|---|
| CN | 102496585 | 6/2012 |
| CN | 102496606 | 6/2012 |
| CN | 102543766 | 7/2012 |
| CN | 102820276 | 12/2012 |
| CN | 202930373 | 5/2013 |
| CN | 103887187 | 6/2014 |

* cited by examiner

… (1)

SEMICONDUCTOR PACKAGING STRUCTURE AND FORMING METHOD THEREFOR

FIELD OF THE INVENTION

The present invention relates to the field of semiconductor package, and particularly relates to a semiconductor package structure and a forming method thereof.

BACKGROUND OF THE INVENTION

As electronic products such as mobile phones, notebooks and the like have been developed towards the direction of miniaturization, portability, ultra-thinness, multimedia and low cost meeting the public demands, a package mode with high density, high performance, high reliability and low cost and an assembly technology thereof have been developed rapidly. Compared with such expensive package modes as BGA (Ball Grid Array) and the like, novel packaging technologies which have been developed rapidly in recent years, for example, QFN (Quad Flat No-leadPackage) package has led to a novel revolution in the field of microelectronic package technology due to such advantages as good thermal and electrical performances, small size, low cost, high productivity and the like.

FIG. 1 is a structural schematic diagram of an existing QFN package structure. The QFN package structure includes a semiconductor chip 14, wherein bonding pads 2 are arranged on the semiconductor chip 1; pins 3 (lead frames), wherein the pins 3 are arranged around the surrounding of the semiconductor chip 1; metal conducting wires 4, wherein the metal conducting wires 4 are used for electrically connecting the bonding pads 2 on the semiconductor chip 1 with the pins 3 surrounding the semiconductor chip 1; a plastic package material 5, wherein the plastic package material 5 seals the semiconductor chip 1, the metal conducting wires 4 and the pins 3, the surfaces of the pins 3 are exposed on the bottom surface of the plastic package material, and the semiconductor chip 1 is electrically connected with an external circuit via the pins 3.

The existing package structure occupies a larger volume, which is unbeneficial to improving the integration level of the package structure.

SUMMARY OF THE INVENTION

A problem to be solved in the present invention is how to improve the integration level of a package structure.

To solve the above problem, the present invention provides a semiconductor package structure, including: a chip, wherein bonding pads and a passivation layer are arranged on the surface of the chip, the passivation layer is provided with first openings for exposing the bonding pads, and a seed layer connected with the bonding pads and columnar salient points stacked on the seed layer are arranged in the first opening; lead frames, wherein each lead frame is provided with a plurality of discrete pins, and internal pins and external pins are respectively arranged on two opposite surfaces of the pins; the chip being flipped on the lead frames, and the columnar salient points being connected with the internal pins; a plastic package layer, wherein the plastic package layer is used for sealing the chip, the columnar salient points and the lead frames and exposing the external pins; each columnar salient point is composed of an adhesive layer, a barrier layer and a welding flux, which are sequentially stacked from bottom to top, the adhesive layer is connected with the seed layer, the barrier layer is stacked on the adhesive layer, and the welding flux is stacked on the barrier layer.

The present invention further provides a forming method of a semiconductor package structure, including: providing a semiconductor chip, wherein bonding pads and a passivation layer are arranged on the surface of the chip, and the passivation layer is provided with first openings for exposing the bonding pads; sequentially forming a heat resistant metal layer and a metal infiltrating layer on the bonding pads and the passivation layer of the chip; forming photoresist on the metal infiltrating layer, wherein the photoresist is provided with a second opening for exposing the metal infiltrating layer on the bonding pads of the chip; sequentially forming an adhesive layer and a barrier layer on the metal infiltrating layer in the second opening; forming a welding flux on the barrier layer; removing the photoresist; etching the heat resistant metal layer and the metal infiltrating layer on the passivation layer until the passivation layer is exposed; refluxing the welding flux to form columnar salient points; providing lead frames, wherein each lead frame is provided with a plurality of discrete pins, and internal pins and external pins are respectively arranged on two opposite surfaces of the pins; flipping the chip provided with the columnar salient points on the lead frames, wherein the columnar salient points are electrically connected with the internal pins; and forming a plastic package layer used for sealing the chip, the columnar salient points and the lead frames and exposing the external pins.

Compared with the prior art, the technical solution of the present invention has the following advantages.

According to the package structure provided by the present invention, the semiconductor chip is flipped above the pins, and the bonding pads on the semiconductor chip are electrically connected with the internal pins by the columnar salient points, so that a transverse area occupied by the formed package structure is decreased, the volume of the entire package structure is smaller, and the integration level of the package structure is improved.

DETAILED DESCRIPTION OF THE EMBODIMENTS

The specific embodiments of the present invention are illustrated in detail below in conjunction with the accompanying drawings.

Figure 1:
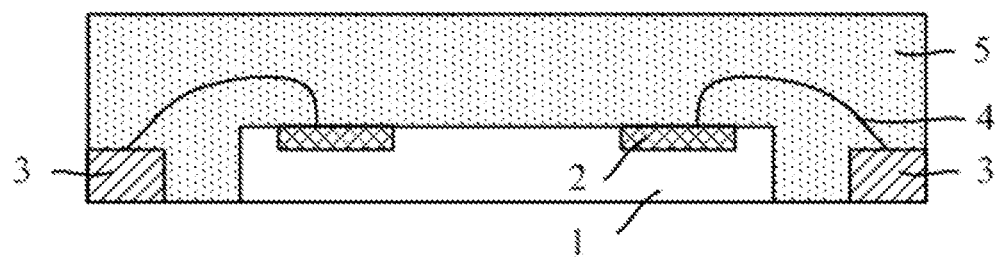
FIG. 1 is a structural schematic diagram of a package structure in the prior art.
Figure 2:
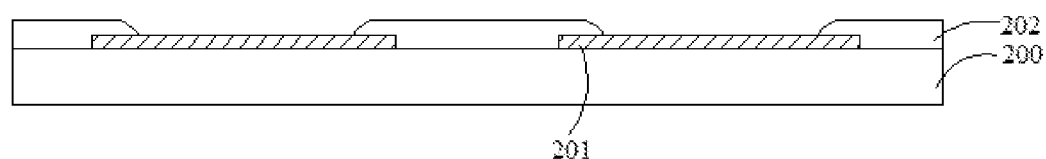
FIG. 2 to FIG. 11 are schematic diagrams of a sectional structure of a forming process of a package structure in an embodiment of the present invention.

At first, see FIG. 2, a semiconductor chip 200 is provided, bonding pads 201 and a passivation layer 202 are arranged on the surface of the semiconductor chip 200, and the passivation layer 202 is provided with first openings for exposing the bonding pads 201. The bonding pads 201 are functional output terminals of the chip 200, and the conduction and transition of an electric function are finally achieved by subsequently formed columnar salient points 206. The material of the passivation layer 202 includes such dielectric materials as silicon oxide, silicon nitride, silicon oxynitride, polyimide, benzene triisobutylene or the like or a mixture thereof, and the passivation layer is used for protecting circuits in the chip 200.

It should be noted that, the bonding pads and the passivation layer of the chip can be initial bonding pads and an initial passivation layer of the chip and can also be transitional bonding pads and a transitional passivation layer, which are formed according to circuit layout design demands; the manner of forming the transitional bonding pads and the transitional passivation layer mainly includes: adopting a rewiring process technology, and carrying out one or more layers of rewiring to transship the initial bonding pads and the initial passivation layer onto the transitional bonding pads and the transitional passivation layer. The rewiring process technology is an existing mature process, is well known to those skilled in the art and will not be repeated herein.

Figure 3:
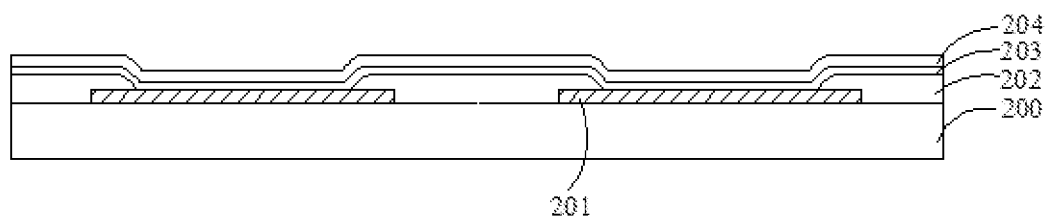

Then, see FIG. 3, a heat resistant metal layer 203 and a metal infiltrating layer 204 are sequentially formed on the bonding pads 201 and the passivation layer 202 of the chip 200.

The material of the heat resistant metal layer 203 can be titanium Ti, chromium Cr, tantalum Ta or a combination thereof, and Ti is preferred in the present invention. The material of the metal infiltrating layer 204 can be one or a combination of copper Cu, aluminum Al and nickel Ni, wherein the material of the metal infiltrating layer 204 is preferably Cu. The heat resistant metal layer 203 and the metal infiltrating layer 204 form a seed layer of a final structure together. The heat resistant metal layer 203 and the metal infiltrating layer 204 can also be formed by an existing evaporation or sputtering or physical vapor deposition method, wherein the preferable method is sputtering. Of course, according to common knowledge of those skilled in the art, the forming method is not merely limited to the sputtering method, all other applicable methods can be applied to the present invention, and the thicknesses of the formed heat resistant metal layer 203 and the metal infiltrating layer 204 are determined according to actual process demands.

Figure 4:
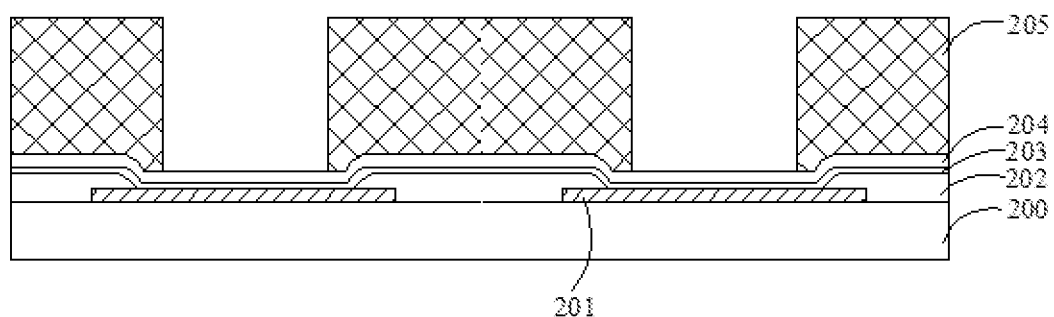

Then, see FIG. 4, photoresist 205 is formed on the metal infiltrating layer 204, and the photoresist 205 is provided with second openings for exposing the metal infiltrating layer 204 on the bonding pads 201 of the chip 200.

The method for forming the photoresist 205 can be rotary coating, and the specific steps of these methods are well known to those skilled in the art, and will not be repeated herein. After the photoresist 205 is formed, the shape of the bonding pads 201 can be specifically defined by means of the existing lithography developing technology, and the openings are formed in the photoresist 205 to expose the metal infiltrating layer 204 on the bonding pads 201.

In the embodiment, each second opening is smaller than each first opening, namely the size of each opening of the photoresist 205 is smaller than that of each opening of the passivation layer of the chip 200, so that the subsequently formed columnar salient points 206 can be located in the first openings, to prevent the columnar salient points 206 from being formed on the passivation layer 202 to cause the reliability problems that the stress is overlarge and the bonding pads 201 are prone to brittle rupture.

Figure 5:
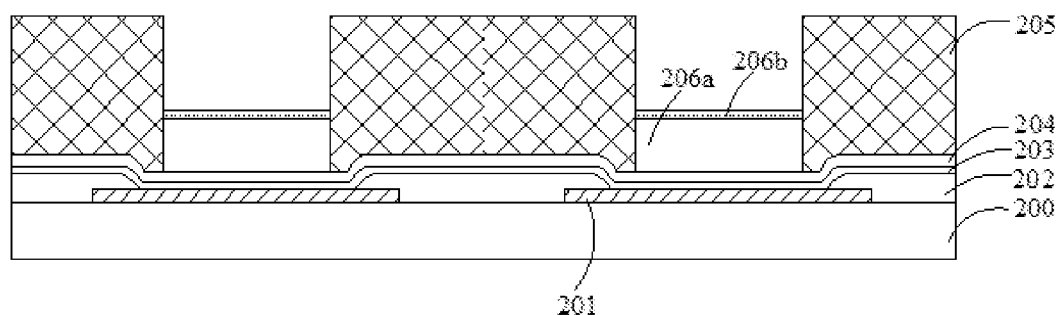

Then, see FIG. 5, an adhesive layer 206a and a barrier layer 206b are sequentially formed on the metal infiltrating layer 204 in the second openings.

In the step, with the residual photoresist 205 on the chip 200 as a mask, the adhesive layer 206a and the barrier layer 206b are sequentially formed on the metal infiltrating layer 204 in the second openings formed in the former step, and the specific process can use through an electroplating manner. Of course, according to common knowledge of those skilled in the art, the forming method is not merely limited to electroplating, and all other applicable methods can be applied to the present invention. The material of the adhesive layer 206a is copper Cu, and the material of the barrier layer 206b is nickel Ni.

The thickness of the copper adhesive layer 206a is 5-50 μm and the specific thickness is 5 μm, 10 μm, 15 μm, 20 μm, 25 μm, 30 μm, 35 μm, 40 μm, 45 μm, 50 μm, or the like. The adhesive layer 206a is a final electric output terminal, namely the columnar structure main body of the columnar salient points 206. The adhesive layer 206a provides an enough substance space to ensure that the subsequently formed welding flux 206c can be firmly attached to the adhesive layer 206a after refluxing without deviation, and improve the binding force with a welding flux 206c at the same time; meanwhile, due to the columnar structure of the adhesive layer 206a, the size of the welding flux 206c is reduced, so that on the premise of ensuring the physical connection reliability of a final product in a welding process, the number of the functional output ports within a unit space is increased, and the package demands of dense distance and multifunction output can be better satisfied.

The thickness of the nickel barrier layer 206b is 1.5 μm-3 μm and the specific thickness is 1.5 μm, 2 μm, 2.5 μm or 3 μm, etc. The barrier layer 206b is used for preventing the material of the subsequently formed welding flux salient points from diffusing into the metal infiltrating layer 204, when the thickness of the Ni layer is smaller than 1.5 μm, Ni disappears finally due to the diffusing effect between adjacent metals, thereby failing to effectively block the subsequently formed welding flux salient points from diffusing into the metal infiltrating layer 204; when the thickness of the Ni layer is larger than 3 μm, the electrical resistivity rises due to the poor electric heating property of the Ni metal itself, to influence the electric heating property of the final product. Therefore, on one hand, the barrier layer (Ni) with a proper thickness can avoid the disappearance thereof due to the diffusing effect, in order to effectively prevent a hole generated between the welding flux and the metal infiltrating layer due to the formation of an intermetallic compound; meanwhile, the electrical resistivity will not be increased by the overlarge thickness of the nickel barrier layer to influence the electric heating property of the product.

Figure 6:
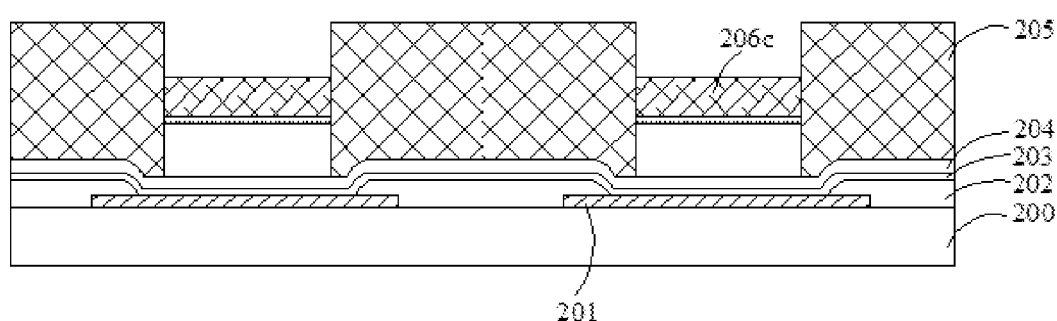

Then, see FIG. 6, the welding flux 206c is formed on the barrier layer 206b.

In the step, still with the photoresist 205 as a mask, the welding flux 206c is formed on the barrier layer 206b, the material forming the welding flux 206c is pure tin or a tin alloy, for example, a tin-silver alloy, a tin-copper alloy, a tin-silver-copper alloy, etc. The method for forming the welding flux 206c can be electrolytic plating, sputtering, screen printing, direct implanting of a prefabricated welding flux ball, or the like. The specific steps of these methods are well known to those skilled in the art, and will not be repeated herein.

In the embodiment, the thickness of the welding flux 206c is 5 μm-70 μm, and for example, the specific thickness is 5 μm, 10 μm, 15 μm, 20 μm, 25 μm, 30 μm, 35 μm, 40 μm, 45 μm, 50 μm, 55 μm, 60 μm, 65 μm or 70 μm, etc. Due to the columnar structure formed in the above step, the use amount of the welding flux 308a can be greatly decreased, so that the material cost is saved on one hand, and more importantly, the size of a small amount of refluxed welding flux 206c is smaller to meet the application demand of dense distance or more functional output points within the same space of the bonding pads 201.

Figure 7:
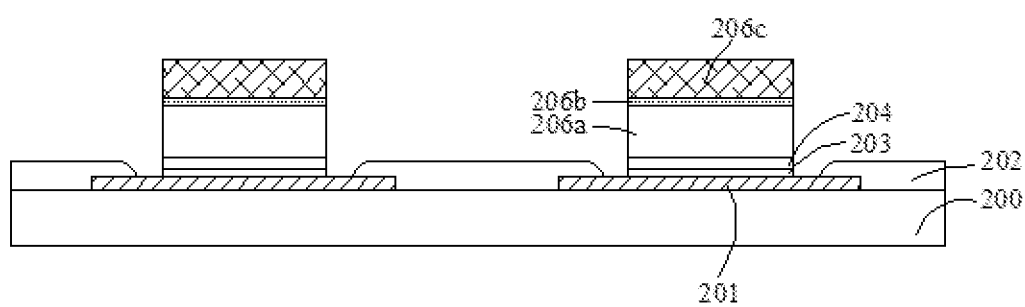

Then, see FIG. 7, the photoresist 205 is removed; with the adhesive layer 206a as a mask, the heat resistant metal layer 203 and the metal infiltrating layer 204 on the passivation layer 202 are etched until the passivation layer is exposed.

After the above-mentioned procedures are finished, the photoresist 205 can be removed and can be removed by a wet process or in a stripping manner, the specific steps of these methods are well known to those skilled in the art, and will not be repeated herein. In the embodiment, the metal infiltrating layer 204 and the heat resistant metal layer 203 on the surface of the chip 200 excluding the welding flux 206c can be removed by spraying acid liquor or soaking the chip in the acid liquor, in order to expose the passivation layer 202.

Figure 8:
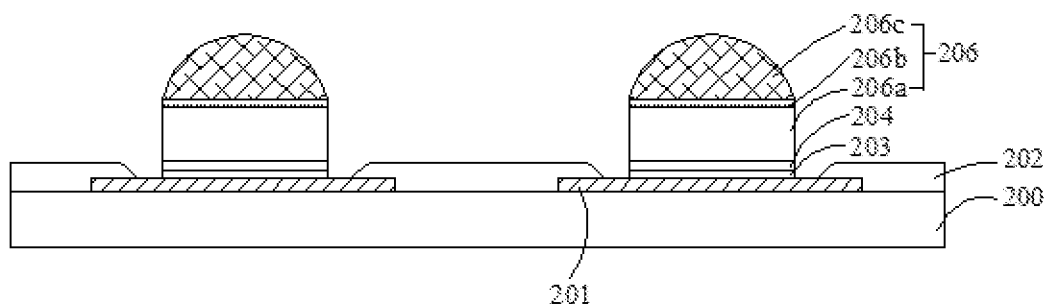

Then, see FIG. 8, the welding flux is refluxed to form the columnar salient points 206.

In the embodiment, the welding flux 206c is refluxed, heated and melted to a hemisphere, to form the columnar salient points 206 consisting of the adhesive layer 206a, the barrier layer 206b and the welding flux 206c, at this time, the functional output terminal of the chip 200 is transitioned from the bonding pads 201 to the columnar salient points 206, and the columnar salient points 206 become the electric output ends of the chip 200.

Figure 9:

Then, see FIG. 9, lead frames 300 are provided, each lead frame 300 is provided with a plurality of discrete pins, and internal pins 301 and external pins 302 are respectively arranged on two opposite surfaces of the pins.

Each lead frame 300 is formed by a punching or etching process, the internal pins 301 serving as the electric input ends of the pins are connected with an active device or a passive device, and the external pins serving as electric output ends are interconnected with next level package, for example, a printed circuit board and the like.

Figure 10:
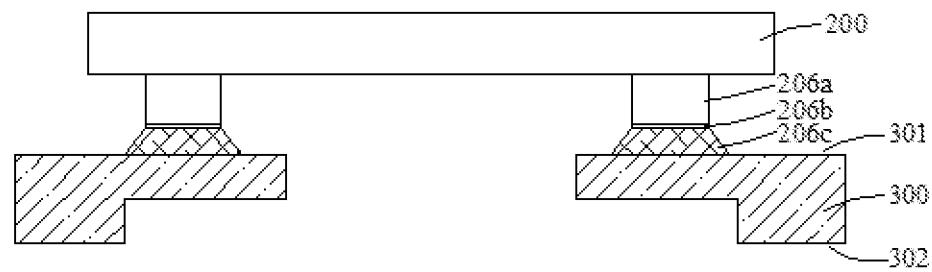

Then, see FIG. 10, the chip 200 provided with the columnar salient points 206 is flipped on the lead frames 300, and the columnar salient points 206 are electrically connected with the internal pins 301.

The bonding pads 201 on the chip 200 are electrically connected with the internal pins 301 through the columnar salient points 206, such that the transverse area occupied by the formed package structure is decreased, the volume of the entire package structure is smaller, and the integration level of the package structure is improved. Meanwhile, compared with the traditional manner of interconnecting the bonding pads 201 with the internal pins 301 through metal leads, the transmission distances between the chip 200 and the internal pins 301 are greatly shortened by the flipped structure in the present invention, and the resistance and the thermal resistance are correspondingly reduced, so that the performance of the entire product is improved, and the columnar salient points 206 serving as the output ends of the chip 200 can better meet the requirements of high-power products.

After the columnar salient points 206 are interconnected with the internal pins 301, a reflux process needs to be carried out, and the reflux process has the functions of welding flux curing, calibration and alignment, such that the columnar salient points 206 and the internal pins 301 can be accurately aligned and fixed.

Figure 11:
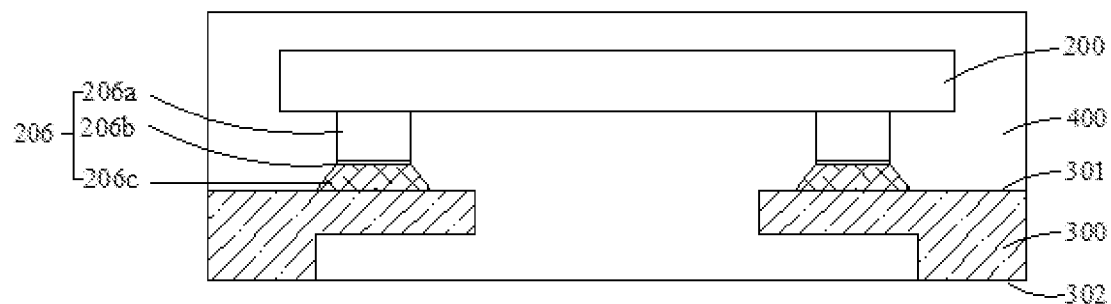

And then, please see FIG. 11, a plastic package layer 400 used for sealing the chip 200, the columnar salient points 206 and the lead frames 300 and exposing the external pins 302 is formed.

The plastic package layer 400 surrounds the chip 200 and fills the area between the chip 200 and the internal pins 301, the plastic package layer 400 also fills the openings between the pins, and the external pins 302 are exposed from the bottom of the plastic package layer 400. When the plastic package layer 400 is filled, since the space between the openings between the pins and the chip 200 is communicated with the space between the chip 200 and the internal pins 301, the fluidity of the plastic package material is improved, so that such defects as gaps in the plastic package layer 400 are avoided.

The plastic package layer 400 is used for protecting and isolating the package structure, the material of the plastic package layer 400 is resin, and the resin can be epoxy resin, polyimide resin, benzocyclobutene resin or polybenzoxazole resin; the resin can also be polybutylene terephthalate, polycarbonate, polyethylene terephthalate, polyethylene, polypropylene, polyolefin, polyurethane, polyolefin, polyether sulfone, polyamide, polyurethane, ethylene-vinyl acetate copolymer or polyvinyl alcohol; the plastic package layer 400 can also be other applicable plastic package materials.

The forming process of the plastic package layer 400 is an injection molding process or a transfer molding process. The forming process of the plastic package layer 400 can also be other applicable processes.

After the plastic package layer 400 is formed, the method further includes: cutting the plastic package layer 400 by adopting a cutting process to form a plurality of discrete semiconductor package units.

Please see FIG. 11, a package structure formed by the above method includes:

a chip 200, wherein bonding pads 201 and a passivation layer 202 are arranged on the surface of the chip 200, the passivation layer 202 is provided with first openings for exposing the bonding pads 201, and a seed layer connected with the bonding pads 201 and columnar salient points 206 stacked on the seed layer are arranged in the first openings;

lead frames 300, wherein each lead frame 300 is provided with a plurality of discrete pins, and internal pins 301 and external pins 302 are respectively arranged on two opposite surfaces of the pins;

the chip 200 being flipped on the lead frames 300, and the columnar salient points 206 being connected with the internal pins 301;

a plastic package layer 400, wherein the plastic package layer 400 is used for sealing the chip 200, the columnar salient points 206 and the lead frames 300 and exposing the external pins 302, wherein each columnar salient point 206 is composed of an adhesive layer 206a, a barrier layer 206b and a welding flux 206c, which are sequentially stacked from bottom to top, the adhesive layer 206a is connected with the seed layer, the barrier layer 206b is stacked on the adhesive layer 206a, and the welding flux 206c is stacked on the barrier layer 206b.

Specifically, the seed layer is formed by stacking a heat resistant metal layer 203 and a metal infiltrating layer 204, the heat resistant metal layer 203 is connected with the bonding pads 201, and the metal infiltrating layer 204 is stacked on the heat resistant metal layer 203.

The material of the heat resistant metal layer 203 is titanium, chromium, tantalum or a combination thereof.

The material of the metal infiltrating layer 204 is copper, aluminum, nickel or a combination thereof.

The material of the adhesive layer 206a is copper, and the thickness of copper is 5-50 μm.

The material of the barrier layer 206b is nickel, and the thickness of nickel is 1.5-3 μm.

The material of the welding flux 206c is pure tin or a tin alloy, and the thickness of the welding flux 206c is 5-70 μm.

To sum up, according to the package structure and the forming method of the package structure in the embedment of the present invention, the semiconductor chip is flipped on the internal pins, and the bonding pads on the semiconductor chip are electrically connected with the pins by a connecting structure formed by the seed layer and the columnar salient points, so that the volume of the entire package structure is smaller, and the forming method of the package structure can be used for achieving chip size level package of the lead frame structure, to improve the integration level of the package structure.

Although the present invention has been disclosed above by preferred embodiments, the present invention is not limited hereto. Any skilled in the art can make various variations and modifications without departing from the spirit and scope of the present invention, accordingly, the scope defined by the claims should prevail over the protection scope of the present invention.

The invention claimed is:

1. A forming method of a semiconductor package structure, comprising:
    providing a semiconductor chip, wherein bonding pads and a passivation layer are arranged on a surface of the chip, and the passivation layer is provided with first openings for exposing the bonding pads;
    sequentially forming a heat resistant metal layer and a metal infiltrating layer on the bonding pads and the passivation layer of the chip, wherein the heat resistant metal layer includes titanium, chromium, or tantalum and the metal infiltrating layer includes copper, aluminum, or nickel;
    forming photoresist on the metal infiltrating layer, wherein the photoresist is provided with a second opening for exposing the metal infiltrating layer on the bonding pads of the chip;
    sequentially forming an adhesive metal layer including copper and a barrier metal layer including nickel on the metal infiltrating layer in the second opening;
    forming a welding flux on the barrier metal layer;
    removing the photoresist;
    etching the heat resistant metal layer and the metal infiltrating layer on the passivation layer until the passivation layer and a portion of the bonding pads is exposed;
    refluxing the welding flux to form columnar salient points;
    providing lead frames, wherein each lead frame is provided with a plurality of discrete pins, and internal pins and external pins are respectively arranged on two opposite surfaces of the pins;
    flipping the chip provided with the columnar salient points on the lead frames, wherein the columnar salient points are electrically connected with the internal pins; and
    forming a plastic package layer used for sealing the chip, the columnar salient points and portions of the lead frames and exposing the external pins.

2. The forming method of the semiconductor package structure of claim 1, wherein the second opening is smaller than the first opening.

3. The forming method of the semiconductor package structure of claim 1, wherein the material of the adhesive metal layer is copper.

4. The forming method of the semiconductor package structure of claim 3, wherein a thickness of the adhesive metal layer is 5-50 µm.

5. The forming method of the semiconductor package structure of claim 1, wherein the material of the barrier metal layer is nickel.

6. The forming method of the semiconductor package structure of claim 5, wherein a thickness of the barrier metal layer is 1.5-3 µm.

7. The forming method of the semiconductor package structure of claim 1, wherein a material of the welding flux is pure tin or a tin alloy.

8. The forming method of the semiconductor package structure of claim 7, wherein a thickness of the welding flux is 5-70 µm.

* * * * *